United States Patent
Parent et al.

(10) Patent No.: US 8,102,690 B2
(45) Date of Patent: Jan. 24, 2012

(54) BANK RE-ASSIGNMENT IN CHIP TO REDUCE IR DROP

(75) Inventors: Richard Michael Parent, Shelburne, VT (US); Ryan Andrew Jurasek, S. Burlington, VT (US); Dave Eugene Chapmen, Shelburne, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 128 days.

(21) Appl. No.: 12/577,704

(22) Filed: Oct. 12, 2009

(65) Prior Publication Data

US 2011/0085402 A1    Apr. 14, 2011

(51) Int. Cl.
G11C 5/00 (2006.01)
G11C 8/00 (2006.01)
G06F 11/06 (2006.01)

(52) U.S. Cl. .............. 365/52; 365/230.03; 365/233.1; 365/233.13; 711/5

(58) Field of Classification Search .......... 365/52, 365/230.03, 233.1, 233.13; 711/115, 167, 711/170, 15
See application file for complete search history.

(56) References Cited

U.S. PATENT DOCUMENTS

| 6,038,655 | A * | 3/2000 | Little et al. ................ 711/5 |
| 6,360,285 | B1 * | 3/2002 | Fenwick et al. ............. 711/5 |
| 6,530,007 | B2 * | 3/2003 | Olarig et al. ............... 711/167 |
| 6,735,144 | B2 * | 5/2004 | Maesako et al. ......... 365/230.03 |
| 7,295,553 | B2 * | 11/2007 | Saitoh ...................... 711/5 |
| 7,685,364 | B2 * | 3/2010 | Shaeffer et al. ............ 711/115 |
| 7,865,674 | B2 * | 1/2011 | Gower et al. ............... 711/5 |

* cited by examiner

*Primary Examiner* — Trong Phan
(74) *Attorney, Agent, or Firm* — Winston Hsu; Scott Margo

(57) ABSTRACT

A chip system that has reduced power consumption under specific operational modes includes: a DDR3 chip that includes: a plurality of pads, disposed at the center of the DDR3 chip; and an array of banks, each bank having a specific logical address, surrounding the pads. The chip system further includes: a clock, coupled to the DDR3 chip, for controlling a rate of data transmission; and a memory controller, coupled to the clock, for coordinating transmitted data with relevant processes, and for selectively reassigning the bank logical addresses according to a specific operational mode.

4 Claims, 2 Drawing Sheets

BANK RE-ASSIGNMENT IN CHIP TO REDUCE IR DROP

BACKGROUND OF THE INVENTION

1. Field of the Invention

This invention relates to DDR3 chip packages, and more particularly, to DDR3 chips wherein bank addresses can be logically reassigned.

2. Description of the Prior Art

Double Data Rate (DDR) Technology allows data transfer to occur on both a rising and a falling edge of a clock. This means that the frequency of data transfer relative to a memory bus clock rate is doubled. DDR3 technology looks set to replace DDR2 chips, by offering reduced power consumption and increased internal data bus widths. Whereas DDR2 chips can only prefetch 4 bits per clock, DDR3 chips can prefetch 8 bits per clock. The number of logical banks in a DDR3 chip is also 8, compared to DDR2's 4.

The DDR3 chip can operate in X4, X8 or X16 modes. In order to minimize test costs, DDR3 chips have an X16 wide datapath, although the maximum required width for operation is X8. For an X16 wide datapath, bank addresses are assigned according to a half banking scheme, wherein each bank consists of two half banks physically located on different halves of the chip. In X4 and X8 modes, only one half of the banks will have datalines driven to a data block located at the centre of the chip, resulting in 64 bits arriving at the central data block—in other words, only one half of the chip will be used. In X16 mode, datalines are driven from both halves of the chip, resulting in 128 bits arriving at the central data block.

Please refer to FIG. 1, which is an illustration of a prior art DDR3 chip 100, showing the bank addresses. A typical DDR3 chip also comprises a clock and a memory controller, but these elements are omitted for simplicity. The DDR3 chip 100 comprises eight banks, which are each divided into half-banks and arranged in different parts of the chip, such that there are eight 'upper' half banks 0U, 1U, 2U, 3U, 4U, 5U, 6U and 7U, and eight 'downer' half banks 0D, 1D, 2D, 3D, 4D, 5D, 6D and 7D. The RIB (not an acronym) refers to the global wordline circuitry which vertically separates the array banks. The DDR3 chip may have a column (COL) or single subarray access (SSA) architecture. The bank array surrounds the pads at the centre. The DDR3 chip 100 also comprises four spokes: Spoke UL (upper left), Spoke UR (upper right), Spoke DL (downer left) and Spoke DR (downer right). Each spoke is shared by four half-banks. As mentioned before, in X4 or X8 modes, data will only be driven from one half of the chip. For example, in X4 mode, the half-banks 4U, 5U, 6U and 7U will be opened and closed in a sequential fashion. As can be seen from the diagram, Spoke UR consists of these 4 half banks: 4U, 5U, 6U and 7U. In the X4 and X8 modes, as only half of the chip is in use, when there is constant toggling between these banks, there will be large voltage (IR, where Ohm's Law states that V=I*R, and IR represents the voltage drop as a current passes through a resistance) drops along the spoke region.

SUMMARY OF THE INVENTION

It is therefore an objective of the present invention to provide a system that can reduce the amount of IR drop along a spoke while toggling between different banks.

A chip system that has reduced power consumption under specific operational modes according to an exemplary embodiment of the present invention comprises: a DDR3 chip that comprises: a plurality of pads, disposed at the centre of the DDR3 chip; and an array of banks, each bank having a specific logical address, surrounding the pads. The chip system further includes: a clock, coupled to the DDR3 chip, for controlling a rate of data transmission; and a memory controller, coupled to the clock, for coordinating transmitted data with relevant processes, and for selectively reassigning the bank logical addresses according to a specific operational mode.

A corresponding method comprises: providing a DDR3 chip, comprising: a plurality of pads, disposed at the centre of the DDR3 chip; and an array of banks, each bank having a specific logical address, surrounding the pads. The method further comprises: providing a clock, for controlling a rate of data transmission for the DDR3 chip; and providing a memory controller for coordinating transmitted data with relevant processes of the DDR3 chip, and for selectively reassigning the bank logical addresses according to a specific operational mode.

These and other objectives of the present invention will no doubt become obvious to those of ordinary skill in the art after reading the following detailed description of the preferred embodiment that is illustrated in the various figures and drawings.

DETAILED DESCRIPTION

The present invention utilizes the technique of bank reassignment to control the amount of current that will be drawn from the supply.

Figure 1:
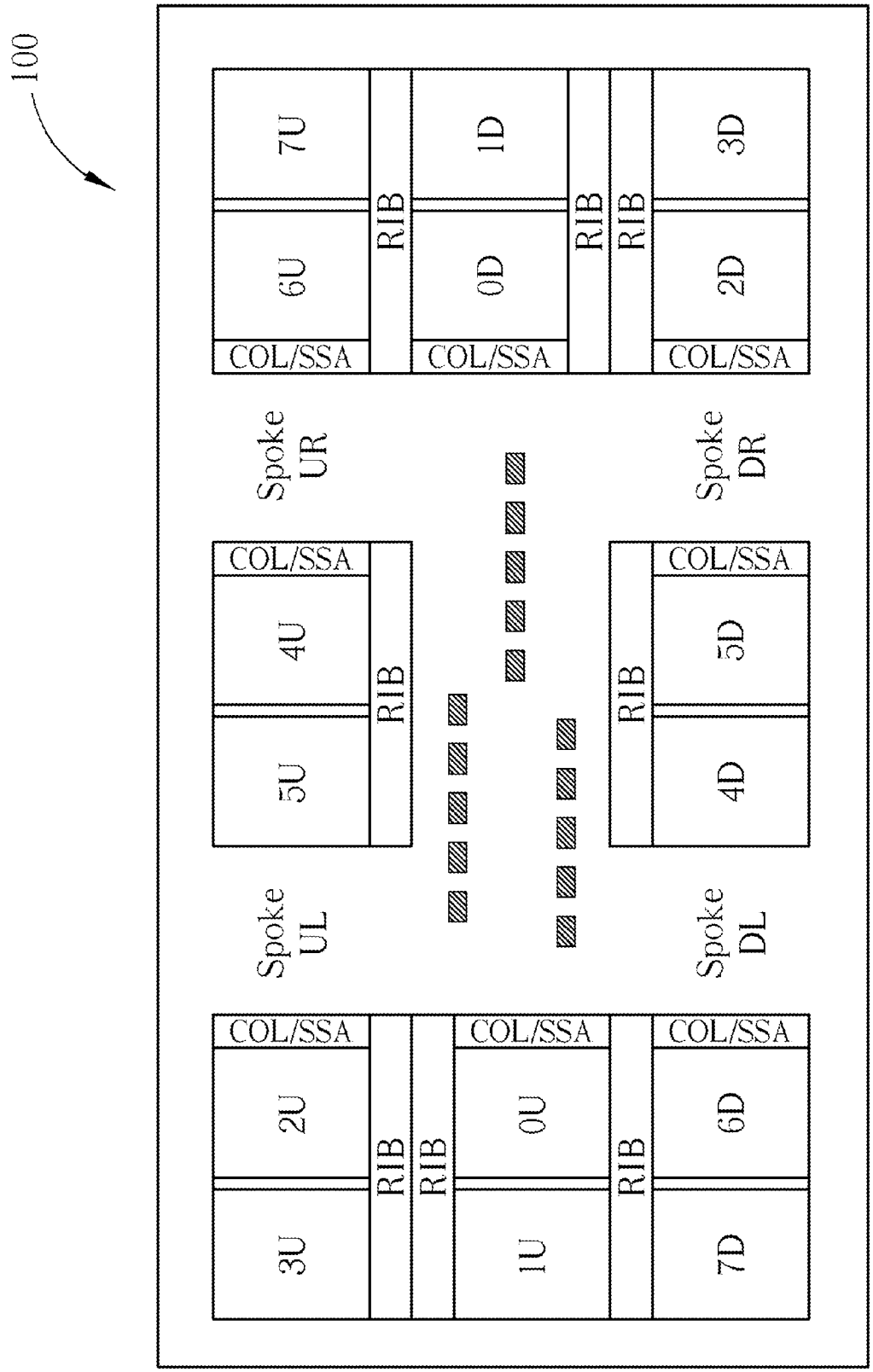
FIG. 1 is an illustration of a prior art DDR3 chip.

As the X16 mode utilizes all banks, there will not be a significant current drain on one spoke of the chip, as toggling between banks occurs over the whole chip. The X16 mode therefore still utilizes the half-bank scheme (as shown in FIG. 1) for operations, but both the X4 and X8 modes utilize a different bank address scheme. The present invention therefore provides means for dynamically switching the bank assignment scheme in order to limit the IR drop across the chip.

Figure 2:
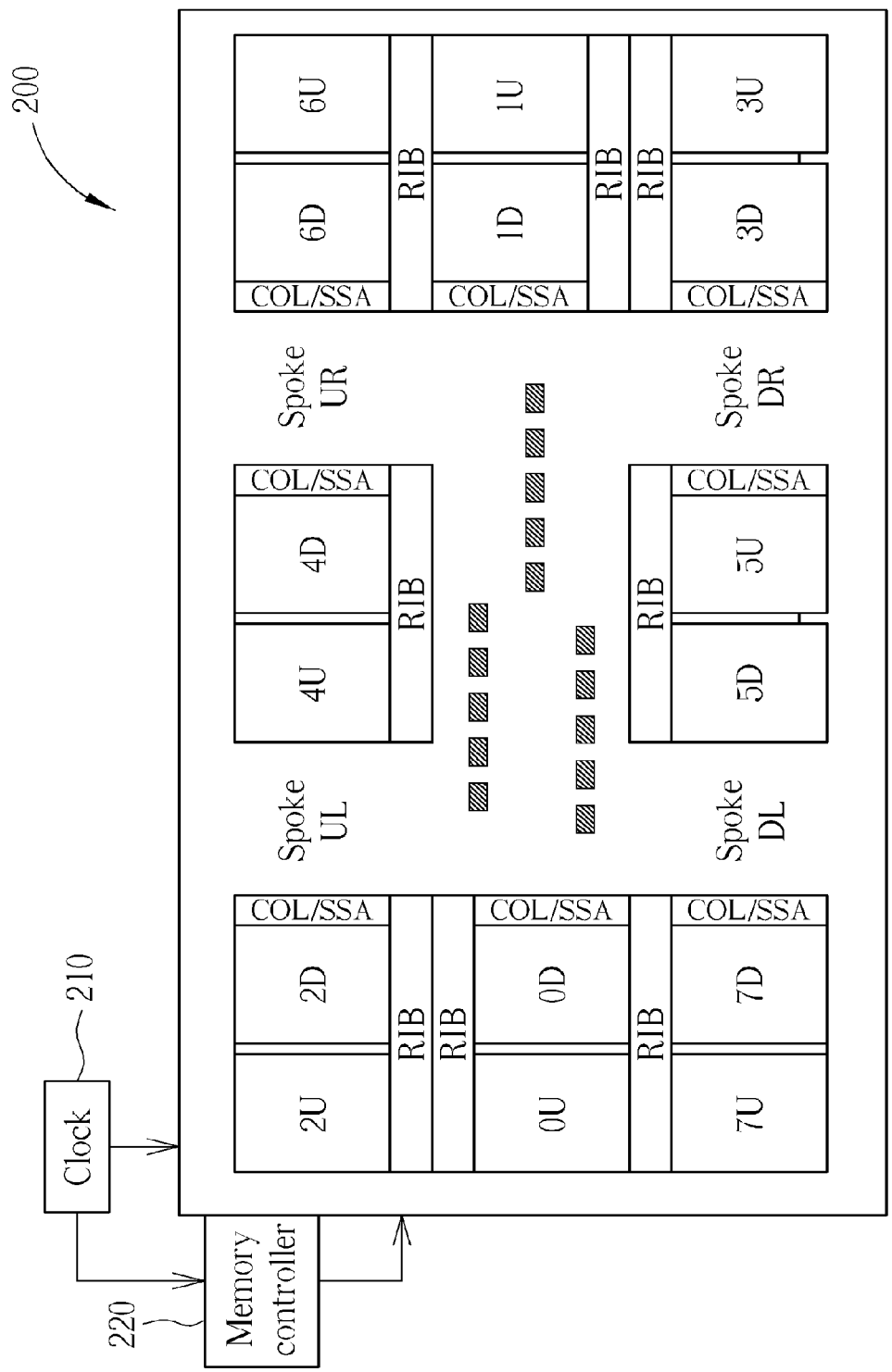
FIG. 2 is an illustration of a DDR3 chip according to an exemplary embodiment of the present invention.

Please refer to FIG. 2, which is a diagram of a chip 200 having reassigned bank addresses, according to an exemplary embodiment of the present invention. As in FIG. 2, the chip 200 has four spokes as in the related art: UL (Upper Left), UR (Upper Right), DL (Downer Left) and DR (Downer Right). Other terms are fully detailed in the description of FIG. 1 and therefore not repeated here. Each bank of the eight banks is still divided into two half banks, 0U, 0D, 1U, 1D, 2U, 2D, 3U, 3D, 4U, 4D, 5U, 5D, 6U, 6D, 7U and 7D, but now, the banks with the same logical address are situated next to each other in a same physical bank. As explained above, this bank reassignment scheme is operable for the X4 and X8 modes. When an X16 mode is in operation, the bank addresses can be dynamically reassigned back to the scheme shown in FIG. 1. The clock 210 controls the data rate at which the chip 200 operates.

As shown in the diagram, the reassignment scheme reassigns bank addresses so that the upper right spoke (UR) consists of two banks: 4 and 6, as opposed to the original scheme where it consists of four banks. As X4 and X8 modes only utilize one half of each bank, there will only be toggling between two banks rather than four, and therefore the current drawn from the supply is halved. For example, in the prior art scheme (please refer to FIG. 1), X4 and X8 modes will toggle between each bank on the upper right spoke (i.e. 4U, 5U, 6U and 7U), while the downer right (DR) spoke is idle. The DDR3 chip will therefore see a significant IR drop along the upper right spoke. With the bank reassignment scheme of the present invention, only two banks on the upper right spoke will be toggled (4U and 6U). Furthermore, there will not be direct toggling between these banks, as bank 5U must be opened and closed before bank 6U can be opened. As bank 5U is on the downer right spoke (as well as bank 3U), there will not be a significant IR drop along the upper right spoke, as both the upper and downer right spokes are operating. The same logic applies to the upper left (UL) and downer left (DL) spokes.

As mentioned above, DDR3 chips utilize a memory controller 220 (global control) for matching data to relevant processes, During test mode (X16), all half banks of the DDR3 chip 200 are tested. In X4 and X8 modes, based upon incoming addresses, datalines are driven from one half bank of a bank to the pads at the centre. Therefore, the bank reassignment can be performed by the memory controller 220. This allows signals carried on datalines to already possess accurate information before they are transmitted to the banks. When the chip will be operated in the X16 mode, the memory controller 220 can similarly reassign bank addresses back to the half-banking scheme.

In summary, the present invention provides a means for dynamically reassigning bank addresses according to an operational mode, for reducing power consumption in a DDR3 chip.

Those skilled in the art will readily observe that numerous modifications and alterations of the device and method may be made while retaining the teachings of the invention.

What is claimed is:

1. A chip system that has reduced power consumption under specific operational modes, comprising:
 a DDR3 chip, comprising:
  a plurality of pads, disposed at a centre of the DDR3 chip;
  an array of banks surrounding the pads, each bank being divided into two half banks, each half bank having a logical address consisting of a bank logical address and a specific logical address where two half banks share a same bank logical address and have a different specific logical address; and
  an upper left spoke situated at an upper left side of the DDR3 chip and disposed between two banks, an upper right spoke situated at an upper right side of the chip and disposed between two banks, a downer left spoke situated at a down left side of the chip and disposed between two banks and a downer right spoke situated at a down right side of the chip and disposed between two banks, such that each spoke is shared by two physical banks;
 a clock, coupled to the DDR3 chip, for controlling a rate of data transmission; and
 a memory controller, coupled to the clock, for coordinating transmitted data with relevant processes, and for selectively reassigning the bank logical addresses according to a specific operational mode so that two half banks corresponding to the same bank logical address are situated in a same bank or that two half banks corresponding to different bank logical addresses are situated in the same bank.

2. The chip system of claim 1, wherein when two half banks corresponding to different bank logical addresses are situated in the same bank, this is a half-banking scheme wherein four banks share a spoke, and when two half banks corresponding to the same bank logical address are situated in the same bank such that two banks share a spoke, this is a full banking scheme, and the memory controller assigns all bank logical addresses to correspond to the full banking scheme in X4 and X8 operating modes, and assigns the bank logical addresses to correspond to the half-banking scheme in X16 operating mode.

3. A method for reducing power consumption in a chip under specific operational modes, the method comprising:
 providing a DDR3 chip, comprising:
  a plurality of pads, disposed at a centre of the DDR3 chip;
  an array of banks surrounding the pads, each bank being divided into two half banks, each half bank having a logical address consisting of a bank logical address and a specific logical address where two half banks share a same bank logical address and have a different specific logical address; and
  an upper left spoke situated at an upper left side of the chip and disposed between two banks, an upper right spoke situated at an upper right side of the chip and disposed between two banks, a downer left spoke situated at a down left side of the chip and disposed between two banks and a downer right spoke situated at a down right side of the chip and disposed between two banks, such that each spoke is shared by two physical banks;
 providing a clock, for controlling a rate of data transmission for the DDR3 chip; and
 providing a memory controller for coordinating transmitted data with relevant processes of the DDR3 chip, and for selectively reassigning all bank logical addresses according to a specific operational mode so that two half banks corresponding to the same bank logical address are situated in a same bank or that two half banks corresponding to different bank logical addresses are situated in the same bank.

4. The method of claim 3, wherein when two half banks corresponding to different bank logical addresses are situated in the same bank, this is a half-banking scheme wherein four banks share a spoke, and when two half banks corresponding to the same bank logical address are situated in the same bank such that two banks share a spoke, this is a full banking scheme, and the method further comprises:
 utilizing the memory controller to assign the bank logical addresses to correspond to the full banking scheme in X4 and X8 operating modes, and assign the bank logical addresses to correspond to the half-banking scheme in X16 operating mode.

* * * * *